United States Patent [19]

Sekimura et al.

[11] Patent Number: 4,667,214

[45] Date of Patent: May 19, 1987

[54] PHOTOSENSOR

[75] Inventors: Nobuyuki Sekimura, Kawasaki; Masaki Fukaya, Yokohama; Katsumi Nakagawa, Kawasaki; Toshiyuki Komatsu, Yokohama; Tatsumi Shoji, Hiratsuka; Teruhiko Furushima, Yokohama, all of Japan

[73] Assignee: Canon Kabushiki Kaisha, Tokyo, Japan

[21] Appl. No.: 621,630

[22] Filed: Jun. 18, 1984

[30] Foreign Application Priority Data

Jun. 24, 1983 [JP] Japan ................................ 58-112924
Jan. 12, 1984 [JP] Japan .................................. 59-2580
Jan. 12, 1984 [JP] Japan .................................. 59-2581

[51] Int. Cl.$^4$ ........................ H01L 27/14; H01L 31/00
[52] U.S. Cl. ......................................... 357/30; 357/2; 357/49

[58] Field of Search .................... 357/30, 2, 65, 49, 47, 357/65, 63, 61, 50

[56] References Cited

U.S. PATENT DOCUMENTS

| 4,291,318 | 9/1981 | Sansregret | 357/30 |
| 4,460,670 | 7/1984 | Ogawa et al. | 357/2 |
| 4,527,865 | 7/1985 | Washo et al. | 350/357 |

Primary Examiner—James W. Davie
Assistant Examiner—Georgia Y. Epps
Attorney, Agent, or Firm—Fitzpatrick, Cella, Harper & Scinto

[57] ABSTRACT

A photosensor comprises a glass substrate, a photoelectric converting layer comprising a silicon-based amorphous material, and a pair of electrode layers in electrical contact with the photoelectric converting layer, wherein one or both sides of the glass substrate are covered with dielectric layers and the photoelectric converting layer is formed upon the dielectric layer.

14 Claims, 6 Drawing Figures

PHOTOSENSOR

BACKGROUND OF THE INVENTION

1. Field of the Invention

The present invention relates to a photosensor for use in a wide variety of photoelectric converters for image information processing, such as facsimile transmitters and receivers and character readers.

2. Description of the Prior Art

The hitherto used photosensors of one-dimensional photodiode type comprising cyrstalline silicon have drawbacks in that the length of array is limited because of restrictions on the size of a producible single crystal of silicon and on the technique of fabrication thereof, and in that the yields thereof are low. Accordingly, when the original to be read is written on a relatively large width paper, e.g. A-4 size paper (210 mm wide), the reading is generally performed through formation of a reduced image of the original picture on the photosensor using a lens system.

When such an image-size reducing optical system is used, reduction of the size of the light receiving system will be difficult, and the area of each picture cell of the photosensor needs to be small in order to maintain the resolving power and therefore a large quantity of light is required to produce a sufficient signal current. Thus, such photosensors are presently used for readers of low-speed type, which take a long reading time, or in readers for which high resolving power is not required.

In view of the above, a photoconductor type of photosensor has been proposed recently in which amorphous silicon (hereinafter designated as a-Si) is utilized as a photoelectric transducing element. A large area or large length photosensor of this type can readily be prepared since this can be made by vacuum deposition of an a-Si thin layer on a glass substrate. In consequence, large width originals can also be read with this a-Si type of photosensor without using any image-size reducing optical system, and the size of such a reader can be reduced with ease.

However, the hitherto proposed photosensors of a-Si photoconductor type still admit of improvement in performance characteristics and production costs. For instance, when the usual glass plate is used as the substrate, an alkali metal ion contained in the glass will diffuse into the a-Si layer to react with the a-Si, deteriorating the photoelectric transducing performance of the a-Si layer. For the purpose of eliminating this drawback, the metal ion diffusion into the a-Si layer is prevented as far as possible, according to the prior art, by using a glass plate of low alkali metal ion content, for example, glass plate #7059 (barium borosilcate glass; alkali content ca. 0.2 wt %), Pyrex glass plate #7740 (borosilicate glass), or Vycor glass plate #7913 (silica glass content 96 wt %), supplied by Corning Glass Co. However, these glass plates of low alkali content are expensive and their surfaces need to be polished because of their inferior smoothness. This leads to high costs of photosensor production.

SUMMARY OF THE INVENTION

In view of the above described state of the prior art, an object of the present invention is to provide a photosensor that will be highly reliable, superior in performance, and inexpensive.

Another object of the present invention is to provide a photosensor which comprises a photoelectric converting part less subject to deterioration and which can be produced at a much reduced cost.

According to the present invention, there is provided a photosensor comprising a glass substrate; a photoelectric converting layer comprising an amorphous material containing silicon as a matrix and a pair of electrode layers in electrical contact with the photoelectric converting layer, wherein at least one side of the glass substrate is covered with a dielectric layer and the photoelectric converting layer is formed upon the dielectric layer.

DETAILED DESCRIPTION OF THE PREFERRED EMBODIMENTS

Figure 1:
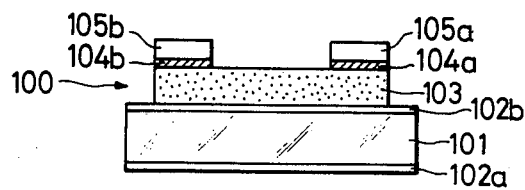
FIG. 1 is a schematic cross-sectional view of a photosensor of the invention.

Referring to the drawings, the preferred embodiments of the present invention are described below.

FIG. 1 is a schematic cross-sectional view of a preferred embodiment of the photosensor according to the present invention. Photosensor 100 in FIG. 1 comprises a glass substrate 101, a dielectric layer 102b, photoelectric transducing layer 103, ohmic contact layers 104a and 104b, and electrode layers 105a and 105b. The dielectric layer 102a is provided as occasion demands. It effectively serves, in the operation of the photosensor 100, to prevent the reaction of the glass substrate 101 with atmospheric oxygen which will form a powdery alkali metal oxide on the surface of the substrate 101, and to prevent thereby the reduction of light transmission when optical signals are applied from the side of the substrate 101. The dielectric layers 102a and 102b which are provided on both sides of the glass substrate 101 can also prevent the photoelectric converting layer of a-Si, during its formation, from reacting with alkali metal ions contained in the substrate 101 at the opposite side of the photoelectric converting layer formation, thus giving a still more improved photosensor.

According to the present invention, it is possible by adoption of such a construction as shown in FIG. 1 to use as the substrate a usual alkali-metal-containing glass plate, relatively inexpensive and readily commercially available, which has not been utilizable for prior art photosensors wherein a-Si is used as a component of the photoelectric converting layer. The photosensor of the present invention can naturally also be constructed by using as the substrate a glass plate containing no alkali or such a small amount of alkali as to have substantially no adverse effect, which has been used conventionally as a favorable material.

Alkali-containing glasses suitably used in the present invention include soda glass which is a kind of soda lime glass, alkali silicate glass, alkali borosilicate glass, borosilicate glass, and other glasses containing alkali metal ions of Li, Na, K, Rb, Cs, or Fr. Examples of such glasses are PK1, BK1, BK7, K8, ZK1, BaK2, KF2, BaLF1, LLF4, LF1, FL7, PKs1, KzF1 (all made by Obara Kogaku Co., Ltd.), BK1, BK7, and K8 (all made by Hoya Glass Co., Ltd.). However, the alkali-rich glass used in the invention is not limited to these examples.

In the photosensor of the present invention, the dielectric layer 102a or 102b need not always be capable of transmitting optical signals when these are applied from the side of the electrode layer (105a and 105b), but both the layers 102a and 102b need to be capable of transmitting optical signals when these are applied from the side of the substrate 101.

Suitable materials for the dielectric layers 102a and 102b, when optical signals are to be applied from the side of the substrate 101, include inorganic oxides, e.g. $SiO_2$, $SiO$, $Al_2O_3$, and $ZrO_2$; inorganic fluorides, e.g. $MgF_2$, $CeF_3$, and $CaF_2$; and organic materials, e.g. polyimides and poly(p-xylylene). These materials can be used alone or in combination. Suitable methods for forming the dielectric layers involve, e.g. vacuum vapor deposition, sputtering, ion plating, dip coating, roll coating, and spray coating. If necessary, the dielectric layers are heat treated during or after formation thereof. A particularly preferred example of these materials is $SiO_2$ containing P atoms in an amounts of up to 10% by weight. When such a material is used for the dielectric layers, it is preferred in particular to use soda glass or borosilicate glass for the glass substrate.

The thickness of the dielectric layer 102b is properly chosen according to the intended application of the photosensor and the performance characteristics required, within the range of preferably 500 to 3000 Å, and more preferably 1000 to 3000 Å.

The photoelectric converting layer in the photosensor of the present invention has the function of converting applied optical signals into electric signals. This layer is formed of a-Si, preferably an a-Si containing hydrogen atoms and/or halogen atoms (hereinafter designated as "a-Si(H,X)").

When the photoelectric converting layer contains hydrogen atoms and/or halogen atoms, the total content of hydrogen and halogen in the layer is in the range of preferably 0.01 to 40 atomic %, more preferably 0.1 to 35 atomic %, most preferably 0.1 to 30 atomic %.

At least one element selected from carbon, oxygen, and the groups III and V of the periodic table may be incorporated in the photoelectric converting layer so as to adapt the photoelectric converting, photoconductive, or optical properties thereof to the intended application of the photosensor. Suitable examples of the elements of groups III and V of the periodic table are B, Al, Ga, In, Tl, N, P, As, Sb, and Bi. In particular, an a-Si layer containing at least one element selected from B, P, and N is preferred as the photoelectric converting layer.

The ohmic contact layers 104a and 104b comprise an $n^+$type of a-Si, preferably an $n^+$type of a-Si(H,X). These types of ohmic contact layers can be formed, for instance, by heavy doping of an a-Si layer or an a-Si(H,X) layer with P.

The electrode layers 105a and 105b comprise for example, a metal such as Al.

Figure 2:
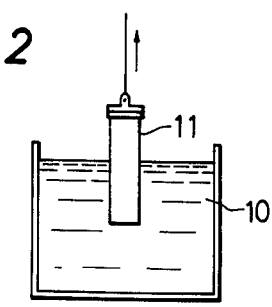
FIG. 2 is a schematic illustration of a process for producing the photosensor.

The photosensor of the present invention having a structure as described above is produced, for instance, in the following manner. As shown in FIG. 2, glass substrate 11, e.g. a 1.1-mm thick soda glass plate of refractive index 1.52 or a 1.1-mm thick borosilicate glass plate of refractive index 1.54, is dipped in $SiO_2$ solution 10 (prepared, for instance, by dissolving a silicon compound $[R_nSi(OH)_{4-n}]$ and an additive in an organic solvent comprising an alcohol, an ester or a ketone). The plate is then taken out of the dipping solution and heated in the air at 300° C. for 1 hour to cure the coating, thereby forming a 1200 Å thick $SiO_2$ coating film. Thereafter, an a-Si layer and then an $n^+$a-Si layer are formed thereon by the plasma CVD method, and further an Al layer is formed thereupon by the vacuum sputtering method. Then a prescribed pattern is formed by the photolithographic technique.

Figure 3:
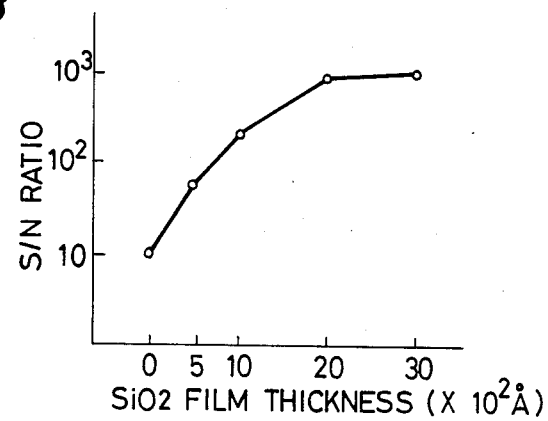
FIG. 3 shows a relation between the thickness of $SiO_2$ coating (dielectric layer) and the S/N ratio.

In a preferred structure of the photosensor as shown in FIG. 1, the thickness of the dielectric layer 102b has been confined in the above range for the following reason: There is a close correlation between the thickness of the dielectric layer 102b and the degradation of performance characteristics of the photosensor with the lapse of time. For example, photosensors having dielectric layer 102b 500 Å, 1000 Å, 2000 Å, and 3000 Å thick, respectively, which consisted of $SiO_2$ containing 10 wt % of P, and a photosensor having no dielectric layer were prepared, allowed to stand for 500 hours under high temperature and humidity conditions of 60° C. and 95% R.H., and examined for changes in S/N ratio (i.e. Ip/Id, where Ip is light current and Id is dark current) by measuring photoelectric currents. The result, as shown in FIG. 3, reveals that the S/N ratio depends upon the thickness of the $SiO_2$ layer, that is, the ratio increases with increasing thickness of this layer and is remarkably low when the layer is thin or is omitted. This is because the dark current (Id) through the photosensor depends upon the whickness of the $SiO_2$ layer that is, Id increases with decreasing thickness of this layer. The Id increase is ascribed to the diffusion of alkali metal ions as an impurity from the glass substrate into the a-Si layer. Since the photosensor is desired to exhibit an S/N ratio of at least $10^2$, the thickness of the dielectric layer is desirably at least 500 Å. The upper limit of the thickness is 3000 Å because the internal stress in the layer increases with increasing thickness of the layer, lowering the adhesion of the layer to the glass substrate and causing the peeling of the layer.

Figure 4:
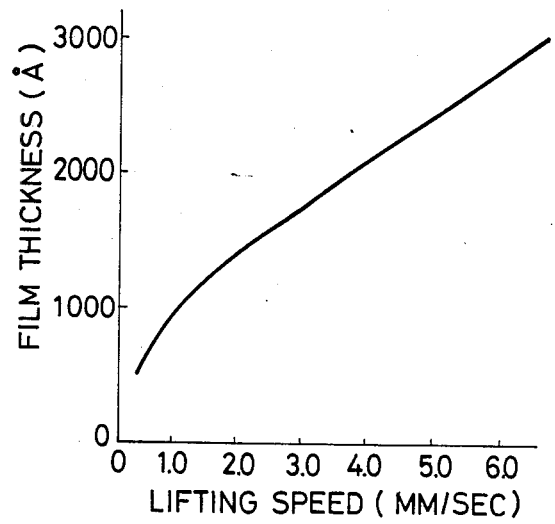
FIG. 4 shows a relation between the substrate lifting speed and the thickness of the dielectric layer in layer formation by dipping.

FIG. 4 shows an example of the relation between the thickness of the resulting dielectric layer and the speed of lifting the substrate to be coated by dipping method. The thickness of the resulting dielectric layer increases in proportion to the lifting speed after dipping.

The photosensor of the present invention has excellent performance characteristics and high reliability, exhibiting stable Ip and Id, since the diffusion of alkali metal ions from the glass substrate into the photoelectric converting layer of a-Si is prevented by providing a dielectric layer between the glass substrate and the photoelectric converting layer as described above. Accordingly, common, inexpensive, alkali-containing glass plates are available for the substrate so that the photosensor can be produced at a low cost.

The photosensor of the present invention, needless to say, can be applied not only to image readers but also to devices such as photo-switches which detect light and convert it into output electric signals.

EXAMPLE 1

30 volume parts of ethyl silicate (supplied by Nippon Kolcoat Co., Ltd. under the tradename Ethyl Sicilate 40) was dissolved in a blend of a mixture (A) consisting of 35 volume parts of ethyl alcohol and 35 volume parts of ethyl acetete and another mixture (B) of 1 volume part of conc. HCl and 1 volume part of water (the blending ratio of mixtures (A) and (B) being 9:1). In this solution were dipped three glass plates (BK 7 of Oguri Kogaku Co., Ltd., $SiO_2$ 68.9%, $B_2O_3$ 10.1%, $Na_2O$ 8.8%, $K_2O$ 8.4%, BaO 2.8%, $As_2O_3$ 1.0%, by weight) each 1.0 mm thick having a refractive index of 1.52. The plates were taken up at different speeds shown in FIG. 4, and heated at 300° C., both of the surfaces of the plates being coated in this manner with 1000 Å, and 3000 Å thick $SiO_2$ films, respectively. One side of each coated plate was overlaid with an a-Si:H layer (corresponding to the photoelectric converting layer 103) and then with n+type a-Si:H layers (corresponding to the ohmic contact layers 104a and 104b), by the plasma CVD method. ("a-Si:H" above designates a-Si containing hydrogen atoms.) Further, Al electrode layers (corresponding to 105a and 105b) were formed upon the ohmic contact layers by vacuum deposition according to a generally known procedure.

Another photosensor was prepared by overlaying BK 7 glass plate directly, without coating with $SiO_2$, in series with the same a-Si:H layer, n+type a-Si:H layers, and Al electrode layers as the above. This photosensor is referred to as sensor P.

Figure 5:
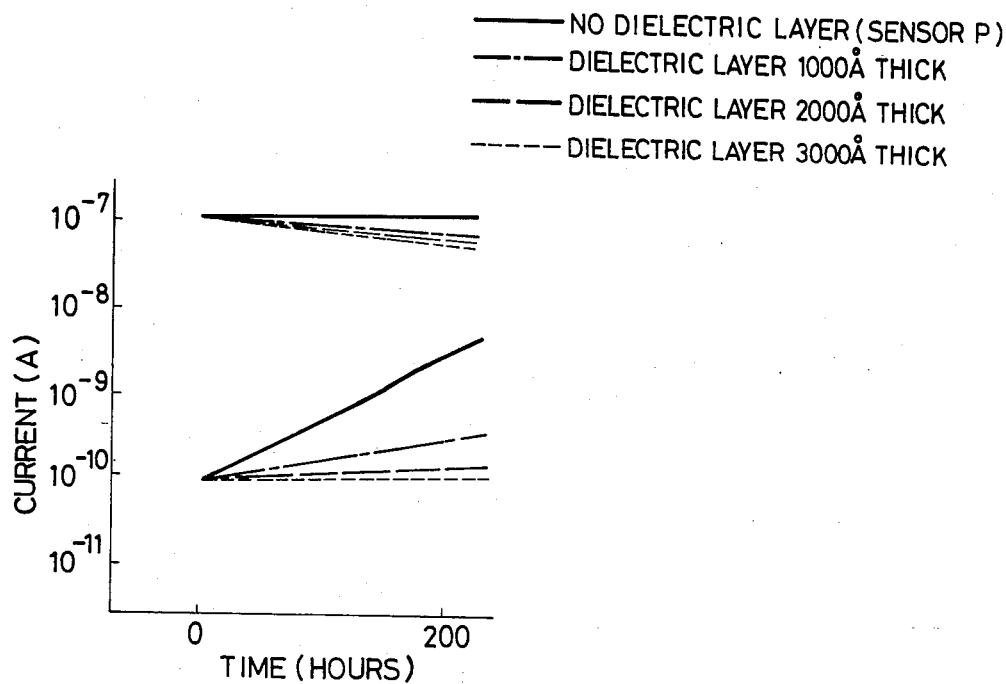
FIG. 5 illustrates the change with time of photoelectric current through a photosensor of the invention.

The thus prepared photosensors were examined for changes in photoelectric currents (Ip and Id) during 200 hours' standing under high temperature and humidity conditions, of 60° C. and 95% R.H. The results were as shown in FIG. 5. No significant Ip change with time was observed, independently of the thickness of the dielectric layer 102b, while the Id change with time decreased with increasing thickness of the dielectric layer 102b; the Id change was less with a thickness of 3000 Å than with a thickness of 1000 Å. It was also revealed that the Ip/Id ratio, i.e. the S/N ratio, after 200 hours was higher and Id was more stable without increasing relatively to Ip when the thickness of the dielectric layer 102b was 2000 Å or 3000 Å than when it was 1000 Å.

Sensor P, on the other hand, indicated that Id was unstable and increased to a great extent with the lapse of time although almost no Ip change with time was observed as shown in FIG. 5, since alkali metal ions, as an impurity, diffuse directly from the glass substrate into the a-Si:H layer. The S/N ratio decreased, showing an extremely low value after 200 hours' standing. Thus sensor P was not suited for practical use.

Figure 6:
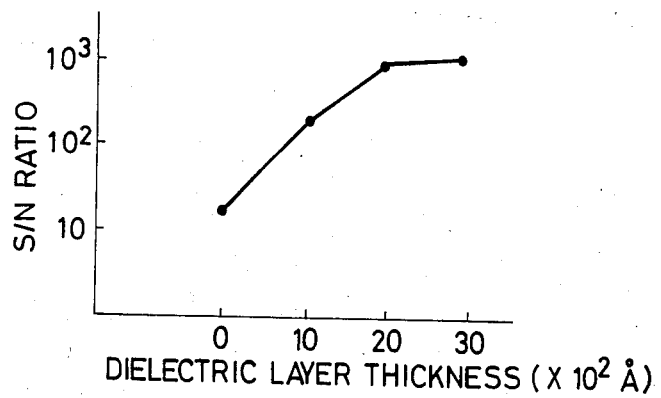
FIG. 6 illustrates the dependence of the light current /dark current ratio upon the thickness of the dielectric layer.

As is apparent from FIG. 6, which illustrates the dependence of S/N ratio upon the thickness of the dielectric layer after 200 hours' standing at 60° C. and 95% P.H., no substantial difference in S/N ratio was observed between the photosensor having the 2000 Å thick dielectric layer and the one having the 3000 Å thick dielectric layer, although larger layer thickness results generally in larger S/N ratio.

What we claim is:

1. A photosensor comprising:
   a glass substrate;
   a photoelectric converting layer comprising an amorphous material containing silicon as a matrix; and
   a pair of electrode layers in electrical contact with the photoelectric converting layer, wherein at least one side of the glass substrate is covered with a dielectric layer and the photoelectric converting layer is formed upon the dielectric layer.

2. The photosensor according to claim 1, wherein the glass substrate is a soda glass plate.

3. The photosensor according to claim 1, wherein the glass substrate is a borosilicate glass plate.

4. The photosensor according to claim 1, wherein the glass substrate contains alkali metal ions.

5. The photosensor according to claim 1, wherein the thickness of the dielectric layers is in the range of 500 to 3000 Å.

6. The photosensor according to claim 1, wherein the dielectric layer comprises silicon dioxide containing phosphorus atoms in an amount of up to 10% by weight.

7. The photosensor according to claim 1, wherein the photoelectric converting layer contains hydrogen atoms.

8. The photosensor according to claim 7, wherein the content of hydrogen atoms in the photoelectric converting layer is in the range of 0.01 to 40 atomic %.

9. The photosensor according to claim 1, wherein the photoelectric converting layer contains halogen atoms.

10. The photosensor according to claim 9, wherein the content of halogen atoms in the photoelectric converting layer is in the range of 0.01 to 40 atomic %.

11. The photosensor according to claim 1, wherein the photoelectric converting layer contains hydrogen atoms as well as halogen atoms.

12. The photosensor according to claim 1, wherein each electrode layer is in electrical contact with the photoelectric converting layer through an ohmic contact layer.

13. The photosensor according to claim 1, wherein each electrode layer is in electrical contact with the photoelectric converting layer through a layer comprising a silicon-based amorphous material of n+type.

14. The photosensor according to claim 1, wherein the photoelectric converting layer contains at least one element selected from carbon, oxygen, and elements belonging to the groups III and V of the periodic table.

* * * * *

UNITED STATES PATENT AND TRADEMARK OFFICE
CERTIFICATE OF CORRECTION

PATENT NO. : 4,667,214
DATED : May 19, 1987
INVENTOR(S) : NOBUYUKI SEKIMURA, ET AL.

It is certified that error appears in the above-identified patent and that said Letters Patent is hereby corrected as shown below:

COLUMN 1

Line 53,   "borosilcate" should read --borosilicate--.

COLUMN 3

Line 28,   "amounts" should read --amount--.

COLUMN 4

Line 34,   "whickness" should read --thickness--.
    Line 34,   "layer" should read --layer,--.

COLUMN 5

Line 2,    "acetete" should read --acetate--.
    Line 11,   "1000 Å, and" should read --1000 Å and--.
    Line 53,   "P.H.," should read --R.H.,--.

UNITED STATES PATENT AND TRADEMARK OFFICE
CERTIFICATE OF CORRECTION

PATENT NO. : 4,667,214

DATED : May 19, 1987

INVENTOR(S) : NOBUYUKI SEKIMURA, ET AL.

It is certified that error appears in the above-identified patent and that said Letters Patent is hereby corrected as shown below:

COLUMN 6

Line 21, "layers" should read --layer--.

Signed and Sealed this

Sixth Day of October, 1987

Attest:

DONALD J. QUIGG

Attesting Officer

Commissioner of Patents and Trademarks